(12) United States Patent
Xiao et al.

(10) Patent No.: US 11,721,567 B2
(45) Date of Patent: **\*Aug. 8, 2023**

(54) SYSTEM AND METHOD FOR OPERATING THE SAME

(71) Applicant: TAIWAN SEMICONDUCTOR MANUFACTURING CO., LTD., Hsinchu (TW)

(72) Inventors: Jia-Rong Xiao, Taoyuan (TW); Wei-Hsiang Huang, Hsinchu County (TW); Sen-Yeo Peng, Hsinchu County (TW); Chui-Ya Peng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/576,994

(22) Filed: Jan. 16, 2022

(65) Prior Publication Data

US 2022/0139742 A1 May 5, 2022

Related U.S. Application Data

(62) Division of application No. 16/510,552, filed on Jul. 12, 2019, now Pat. No. 11,227,780.

(60) Provisional application No. 62/733,627, filed on Sep. 20, 2018.

(51) Int. Cl.
*H01L 21/67* (2006.01)

(52) U.S. Cl.
CPC .. *H01L 21/67253* (2013.01); *H01L 21/67057* (2013.01)

(58) Field of Classification Search
CPC ................................................ H01L 21/67253
See application file for complete search history.

(56) References Cited

U.S. PATENT DOCUMENTS

| | | | |
|---|---|---|---|
| 6,146,469 | A | 11/2000 | Toshima |
| 11,075,095 | B2 | 7/2021 | Kobayash et al. |
| 2001/0047864 | A1 | 12/2001 | Sloan et al. |
| 2002/0001962 | A1 | 1/2002 | Yokoi |
| 2006/0042756 | A1 | 3/2006 | Miyazaki et al. |
| 2014/0045339 | A1 | 2/2014 | Iwata et al. |
| 2015/0380323 | A1 | 12/2015 | Yang et al. |

FOREIGN PATENT DOCUMENTS

| | | |
|---|---|---|
| CN | 1119731 A | 4/1996 |
| CN | 1295504 A | 5/2001 |
| CN | 1331487 A | 1/2002 |

(Continued)

*Primary Examiner* — Jason Y Ko
(74) *Attorney, Agent, or Firm* — Maschoff Brennan

(57) ABSTRACT

A system includes a cleaning device and a concentration measuring device. The cleaning device includes a first pipe and a first pump. The first pump is configured to move first liquid in the first pipe. Two terminals of the first pump are respectively coupled to the first pipe. The concentration measuring device includes a tube, a cooler, a concentration meter and a second pump. The tube is coupled to the first pipe, and is configured to retrieve the first liquid. The cooler covers the tube to cool the first liquid. The concentration meter is configured to measure a concentration of the first liquid cooled by the cooler. The second pump is coupled to the tube, and is configured to move the first liquid according to the concentration.

20 Claims, 11 Drawing Sheets

(56) References Cited

FOREIGN PATENT DOCUMENTS

| | | | |
|---|---|---|---|
| CN | 1741249 | A | 3/2006 |
| CN | 101013661 | A | 8/2007 |
| CN | 101276742 | A | 10/2008 |
| CN | 105895560 | A | 8/2016 |
| JP | 06-132272 | A | 5/1994 |
| TW | 583516 | B | 4/2005 |
| TW | 200947171 | A | 11/2009 |
| TW | 201308419 | A | 2/2013 |

SYSTEM AND METHOD FOR OPERATING THE SAME

RELATED APPLICATIONS

The present application is a divisional application of U.S. application Ser. No. 16/510,552, filed on Jul. 12, 2019, now U.S. Pat. No. 11,227,780, issued Jan. 18, 2022, which claims priority benefit U.S. Provisional Application Ser. No. 62/733,627, filed Sep. 20, 2018, which is herein incorporated by reference.

BACKGROUND

Due to manufacturing acquirements, residues of a semiconductor in each manufacturing process shall be removed. However, there is no sufficient way to remove the residues of the semiconductor. Therefore, removing the residues of the semiconductor sufficiently and precisely becomes a critical issue in a field of a semiconductor technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
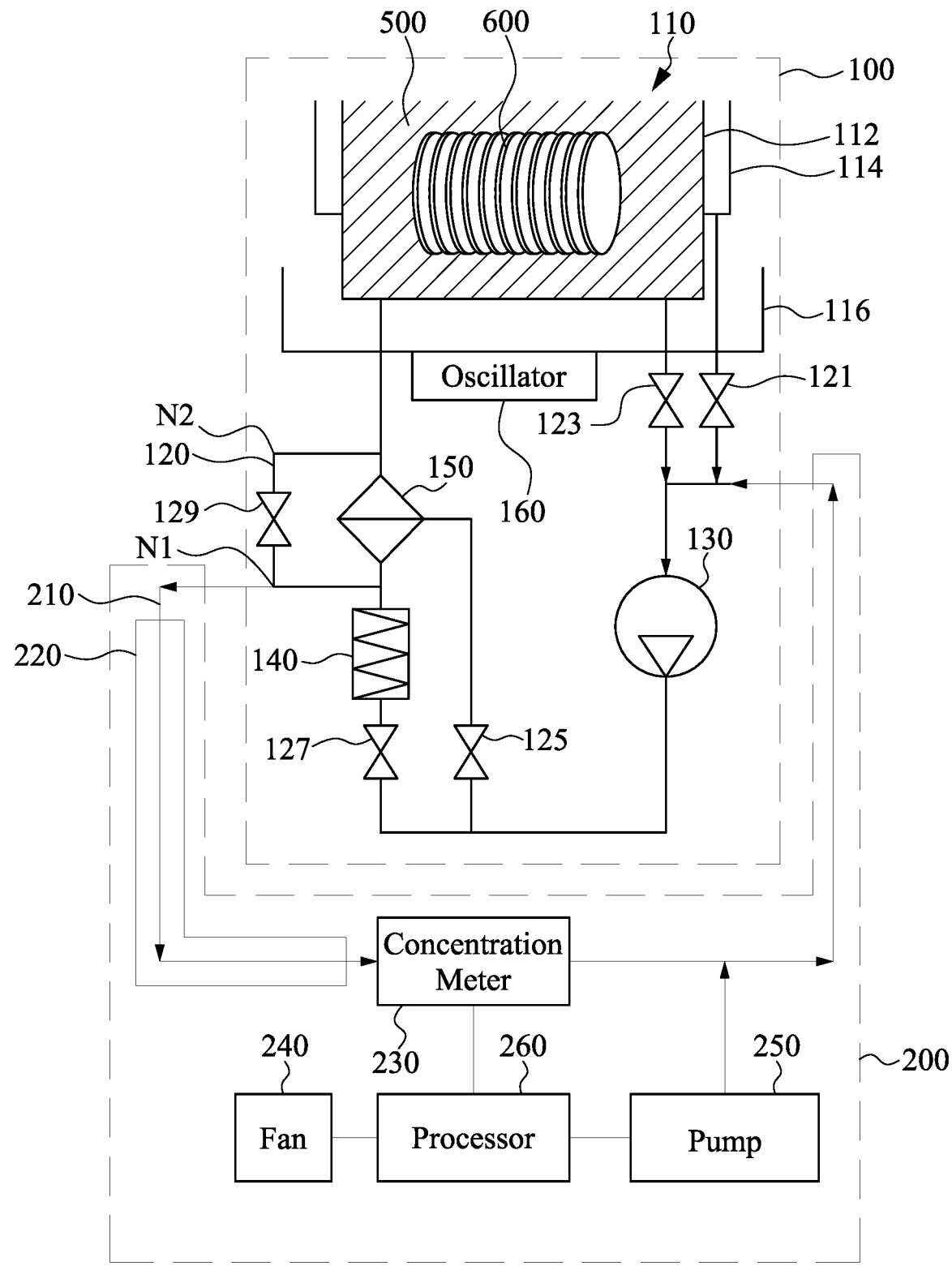
FIG. 1 is a schematic diagram of a system, in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

The terms "comprise," "comprising," "include," "including," "has," "having," etc. used in this specification are open-ended and mean "comprises but not limited."

Reference is now made to FIG. 1. FIG. 1 is a schematic diagram of a system, in accordance with various embodiments of the present disclosure.

As illustratively shown in FIG. 1, the system includes a cleaning device 100 and a concentration measuring device 200. The cleaning device 100 includes a tank 110, a pipe 120, a pump 130, a heater 140, a filter 150, and an oscillator 160. On the other hand, the concentration measuring device 200 includes a tube 210, a cooler 220, a concentration meter 230, a fan 240, a pump 250, and a processor 260.

In some embodiments, reference is now made to the cleaning device 100. The pipe 120 is coupled to the tank 110. The two terminals of the pump 130 are respectively coupled to the pipe 120. Explained in another way, the pipe 120 extends through the pump 130. The two terminals of the heater 140 are respectively coupled to the pipe 120. Explained in another way, the pipe 120 extends through the heater 140. The two terminals of the filter 150 are respectively coupled to the pipe 120. Explained in another way, the pipe 120 extends through the filter 150.

In various embodiments, reference is now made to the concentration measuring device 200. The tube 210 is couple to the pipe 120 of the cleaning device 100. The cooler 220 covers the tube 210. The concentration meter 230 is coupled to the tube 210. The processor 260 is coupled to the concentration meter 230, the fan 240, and the pump 250. The pump 250 is coupled to the tube 210.

The above discussion merely describes exemplary connections that can be made in accordance with various alternative embodiments. It is understood that such various alternative embodiments are not limited to the specific connections described above or those shown in FIG. 1.

Figure 2:
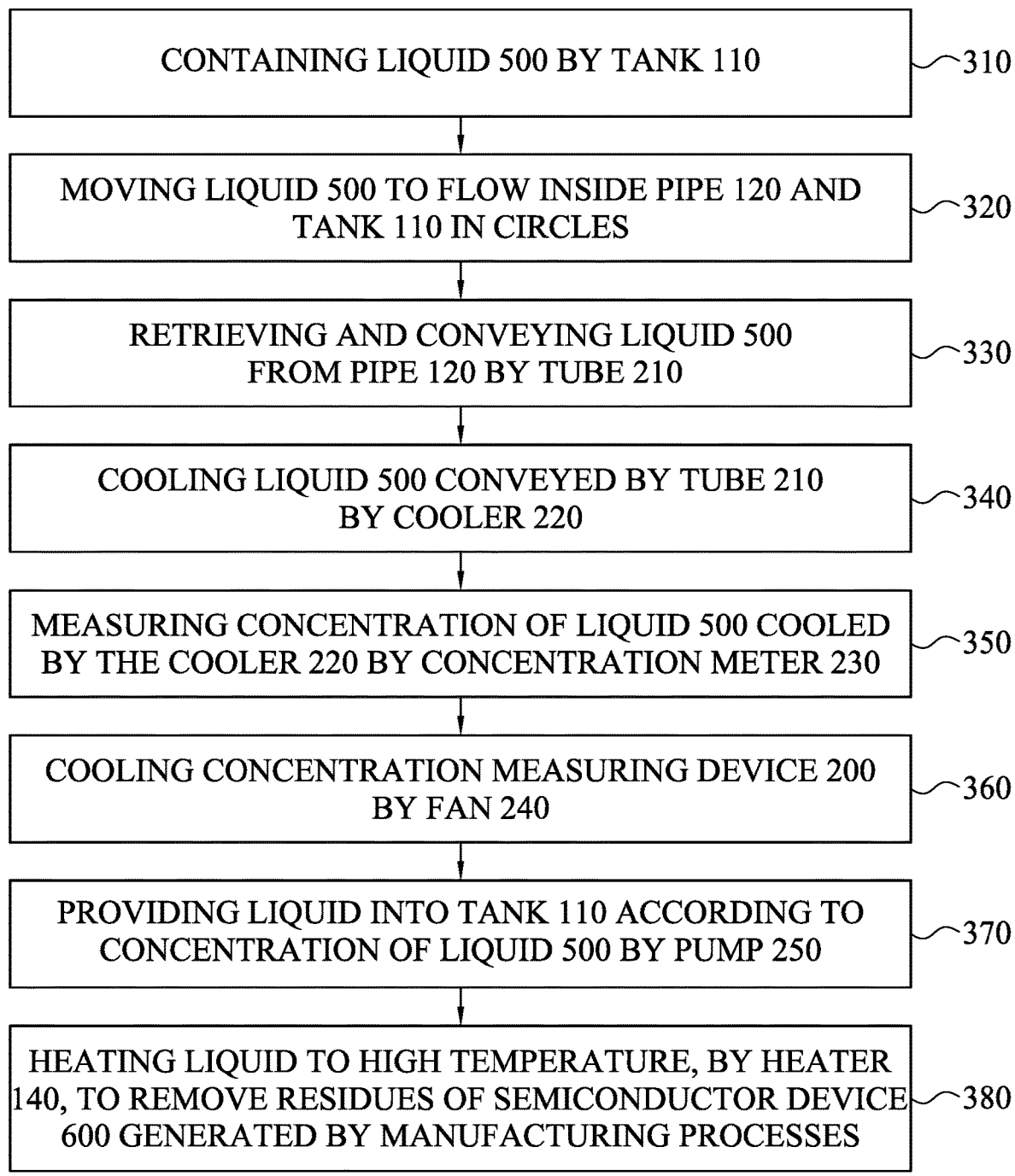
FIG. 2 is a flow chart of a method illustrating operations of the system in FIG. 1, in accordance with various embodiments of the present disclosure.

Reference is now made to FIG. 2. FIG. 2 is a flow chart of a method 300 for operating the system in FIG. 1, in accordance with various embodiments of the present disclosure.

As illustratively shown in FIG. 2, in operation 310, the tank 110 is configured to contain the liquid 500. The liquid 500 is used for removing residues of a semiconductor device 600 generated by manufacturing processes. In some embodiments, the liquid 500 is, for example, an etch residue remover, a positive photoresist stripper, or any suitable liquid for removing residues generated during manufacturing processes. In various embodiments, the manufacturing process is, for example, a deposition process, a photoresist coating process, an etching process, a patterning process, a removing process, or other processes for manufacturing semiconductor devices.

In operation 320, the liquid 500 is moved to flow inside the pipe 120 and the tank 110 in circles. In some embodiments, the tank 110 includes an inner tank 112 and an outer tank 114. The inner tank 112 is configured to contain the liquid 500 inside. If the semiconductor device 600 is soaked in the liquid 500 and the inner tank 112 is overflowing, the overflowed liquid 500 is further contained by the outer tank 114. In various embodiments, the circle of the liquid 500 is started from the outer tank 114, the valve 121 is opened to let the liquid 500 in the outer tank 114 flow through it into the pipe 120, and then the valve 123 is opened to let the liquid 500 in the inner tank 112 flow through it into the pipe 120. Subsequently, the liquid 500 flows through the valves 121, 123 into the pump 130, and the pump 130 moves the liquid 500 in the pipe 120. In some embodiments, the pump 130 is, for example, a direct lift pump, a displacement pump, a gravity pump, or any suitable device for moving the liquid 500 in the pipe 120 by mechanical action.

If the liquid 500 in the tank 112 is not enough and the temperature is not higher than a predetermined temperature, the valve 125 is closed and the valve 127 is opened to let the liquid 500 flow through it into the pipe 120. Next, the liquid 500 flows through and heated by the heater 140. If the liquid 500 in the tank 112 is not enough and the temperature is not higher than the predetermined temperature, the liquid 500 is bypassed through the valve 129 into the inner tank 112. In some embodiments, in condition that the liquid 500 in the tank 112 is not enough and the temperature is not higher than the predetermined temperature, the pressure of the pipe 120 and the thickness of the liquid 500 are both too high. In such condition, the liquid 500 cannot flow through the filter 150, or the filter 150 will be damaged by the high pressure in the pipe 120 or the high thickness of the liquid 500. In various embodiments, the valves 121, 123, 125, 127, 129 are, for example, hydraulic valves, pneumatic valves, or any suitable valve for controlling the liquid 500 to flow through it. In some embodiments, the heater 140 is, for example, an electric heater, a heating lamp, a heating jacket, or any suitable device for heating the liquid 500.

When the liquid 500 in the tank 112 is enough and the temperature is higher than the predetermined temperature, the residues of the semiconductor device 600 can be removed by the cleaning device 100. After removal of the residues of the semiconductor device 600, there are particles in the liquid 500. The filter 150 is configured to filter the particles in the liquid 500. In such condition, the circle of the liquid 500 is started from the outer tank 114, the valve 121 is opened to let the liquid 500 in the outer tank 114 flow through it into the pipe 120, and the valve 123 is then opened to let the liquid 500 in the inner tank 112 flow through it into the pipe 120. Subsequently, the liquid 500 flows through the valves 121, 123 into the pump 130, and the pump 130 moves the liquid 500 in the pipe 120. Next, the valve 125 is opened and the valve 127 is closed to let the liquid 500 flow through the valve 125 into the filter 150. The filter 150 filters the particles in the liquid 500 and provides the liquid 500 without the particles to the inner tank 112. In some embodiments, the capacity of the tank 110 is in a range of 70 L (liter) to 120 L. If the capacity of the tank 110 is too high, it is hard to cool the liquid 500 in the tank 110. On the other hand, if the capacity of the tank 110 is too low, it is hard to use enough liquid 500 to remove the residues of the semiconductor device 600, such that the capacity of the tank 110 is in a predetermined range.

In operation 330, the tube 210 is configured to retrieve and convey the liquid 500 from the pipe 120. As illustratively shown in FIG. 1, the tube 210 retrieves the liquid 500 from the node N1 of the pipe 120. However, in various embodiments, the tube 210 may retrieve the liquid 500 from the node N2 of the pipe 120, or any suitable part of the pipe 120 depending on actual requirements. In some embodiments, the diameter of the pipe 120 is in a range of 3 cm (centimeter) to 10 cm. In various embodiments, the diameter of the pipe 120 is, for example, 10 cm. If the diameter of the pipe 120 is too high, it is hard for the pump 250 to move the liquid 500 inside the pipe 120. On the other hand, if the diameter of the pipe 120 is too low, it is hard to let the liquid 500 move inside the pipe 120 and the tank in circles, such that the diameter of the pipe 120 is in a predetermined range. In some embodiments, the diameter of the tube is in a range of 5 mm (millimeter) to 1 cm. In various embodiments, the diameter of the tube 210 is, for example, 5 mm. The tube 210 is used for sampling, and the diameter of the tube 210 may be smaller than that of the pipe 120. The flow rate of the liquid 500 in the tube 210 is inversely proportional to the cross-sectional of the tube 210. Therefore, the flow rate of the liquid 500 in the tube 210 will be too fast if the diameter of the tube 210 is less than 5 mm. When the flow rate of the liquid 500 in the tube 210 is too fast, the medicament does not have enough time to mix with the liquid 500, such that the concentration of the liquid 500 will be lower than the actual concentration, and the measurement result of the concentration meter 230 is not precise. On the contrary, the flow rate of the liquid 500 in the tube 210 will be too slow if the diameter of the tube 210 is larger than 1 cm. When the flow rate of the liquid 500 in the tube 210 is too slow, the concentration meter 230 cannot measure the concentration of the liquid 500.

Figure 3:
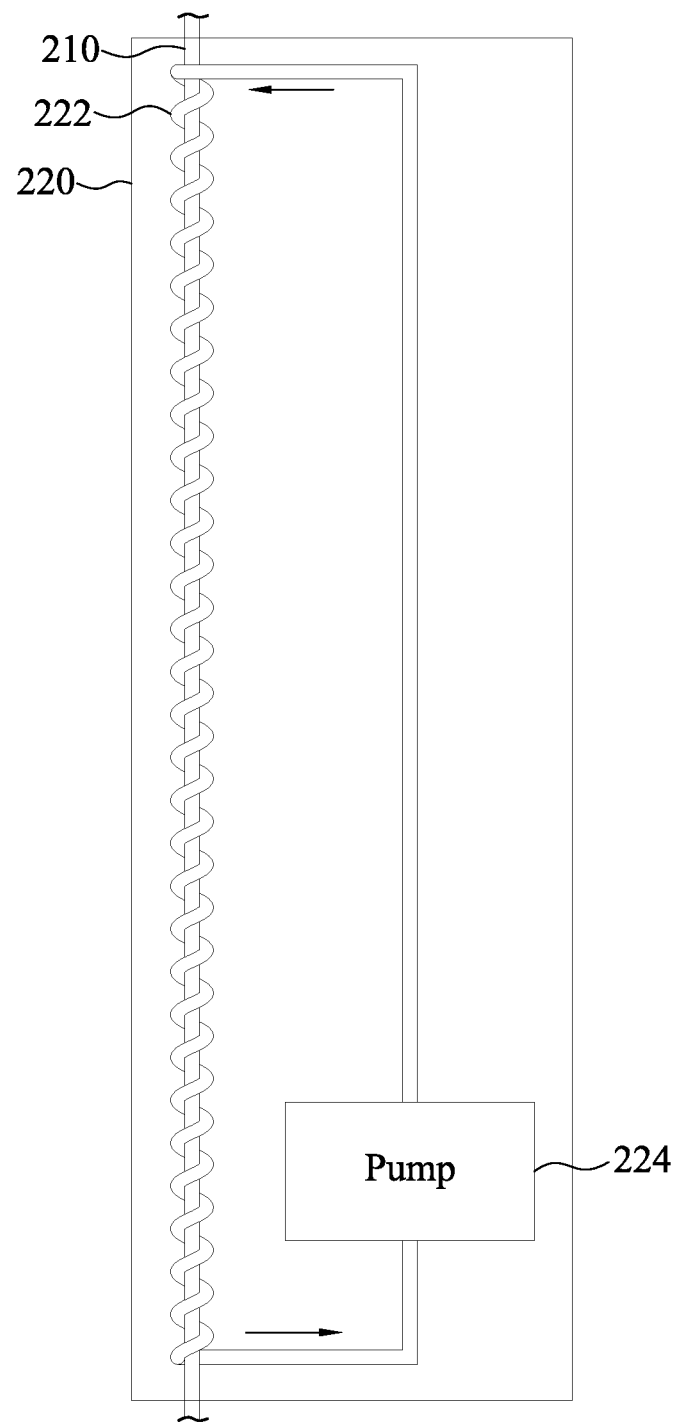
FIG. 3 is a schematic diagram of the cooler of the system as shown in FIG. 1, in accordance with various embodiments of the present disclosure.

In operation 340, the cooler 220 is configured to cool the liquid 500 conveyed by the tube 210. As illustratively shown in FIG. 1, the cooler 220 covers the tube 210 in order to cool the liquid 500 conveyed by the tube 210 efficiently. In some embodiments, the cooler 220 is, for example, a water-cooling apparatus. For easy to understand the structure of the cooler 220, reference is now made to FIG. 3. FIG. 3 is a schematic diagram of the cooler 220 of the system as shown in FIG. 1, in accordance with various embodiments of the present disclosure.

As illustratively shown in FIG. 3, the cooler 220 includes a spiral hose 222, and the spiral hose 222 is disposed around the tube 210. In some embodiments, the spiral hose 222 is disposed around and contacted the tube 210 for facilitating the cooler 220 to cool the liquid 500 conveyed by the tube 210. In various embodiments, the spiral hose 222 is, for example, a Polyurethane (PU) tube, a PolyVinyl Chloride (PVC) tube, or any suitable kind of tube. In some embodiments, the liquid in the spiral hose 222 is, for example, deionized water, condensate, or any suitable liquid for moving in circles in the spiral hose 222 to cool the liquid 500 conveyed by the tube 210.

As illustratively shown in FIG. 3, the cooler 220 includes a pump 224, the pump 224 is coupled to the spiral hose 222, and the pump 224 is configured to move the liquid in the spiral hose 222. In various embodiments, the pump 224 is disposed adjacent to the node N1 as shown in FIG. 1. In some embodiments, the pump 224 is, for example, a submersible pump, an on land pump, or any suitable pump for moving the liquid in the spiral hose 222. As illustratively shown in FIG. 3, the pump 224 moves the liquid in a counterclockwise direction. However, the pump 224 may move the liquid in a clockwise direction depending on actual requirements.

The above discussion merely describes exemplary connections and operations that can be made in accordance with various alternative embodiments. It is understood that such various alternative embodiments are not limited to the specific connections and operations described above or those shown in FIG. 3.

Figure 4:
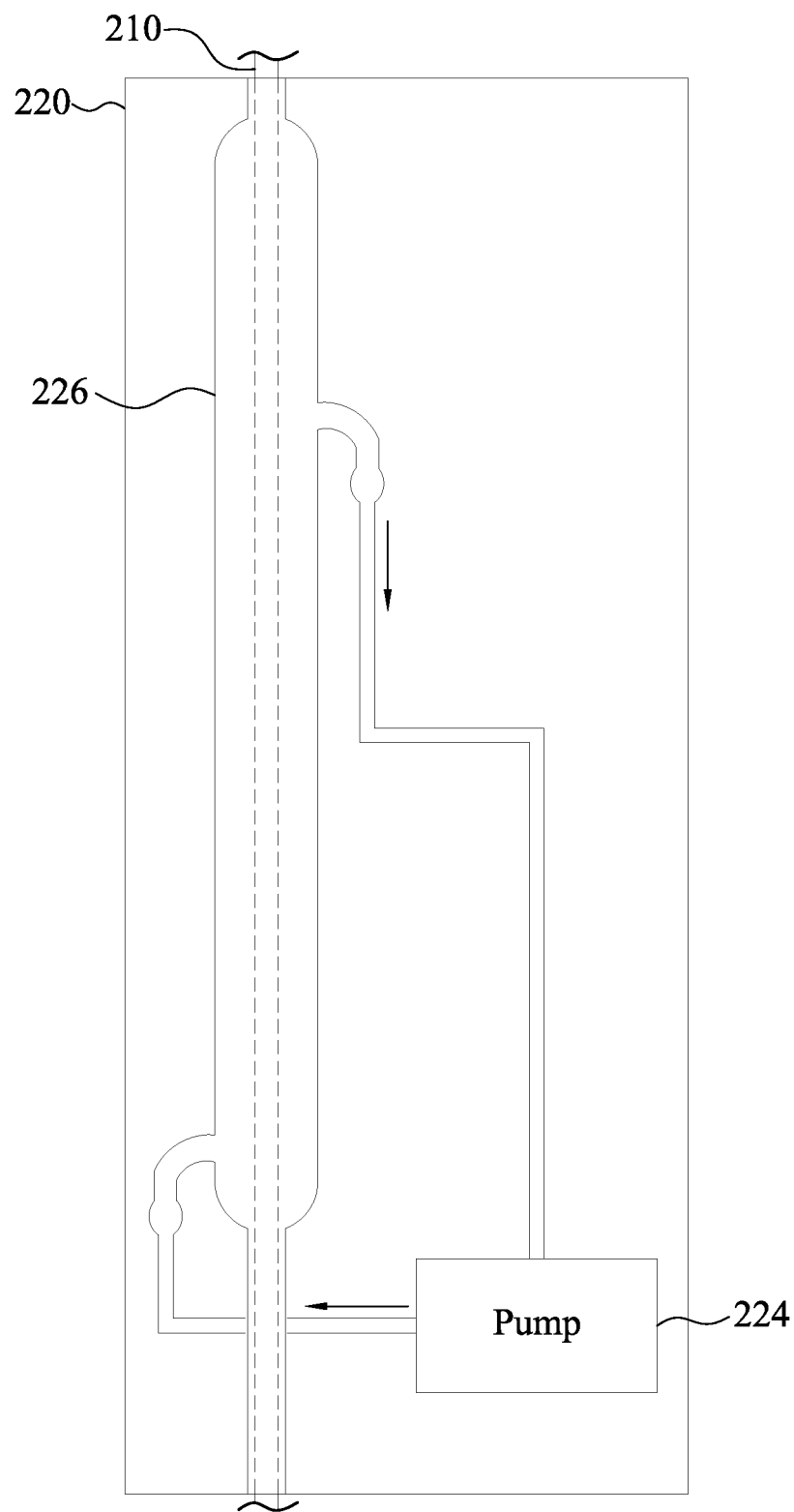
FIG. 4 is a schematic diagram of the cooler of the system as shown in FIG. 1, in accordance with various embodiments of the present disclosure.

For understanding the structure of the cooler 220, reference is now made to FIG. 4. FIG. 4 is a schematic diagram of the cooler 220 of the system as shown in FIG. 1, in accordance with various embodiments of the present disclosure.

As illustratively shown in FIG. 4, the cooler 220 includes, for example, a condenser 226. The tube 210 may be disposed inside the condenser 226. Explained in another way, the condenser 226 fully covers the tube 210. In various embodiments, the liquid in the condenser 226 is, for example, deionized water, condensate, or any suitable liquid for moving in circles in the condenser 226 to cool the liquid 500 conveyed by the tube 210.

As illustratively shown in FIG. 4, the cooler 220 includes a pump 224, the pump 224 is coupled to the condenser 226, and the pump 224 is configured to move the liquid in the condenser 226. In various embodiments, the pump 224 is disposed adjacent to the node N1 as shown in FIG. 1. As illustratively shown in FIG. 4, the pump 224 moves the liquid in a clockwise direction. However, the pump 224 may move the liquid in a counterclockwise direction depending on actual requirements.

The above discussion merely describes exemplary connections and operations that can be made in accordance with various alternative embodiments. It is understood that such various alternative embodiments are not limited to the specific connections and operations described above or those shown in FIG. 4.

Figure 5:
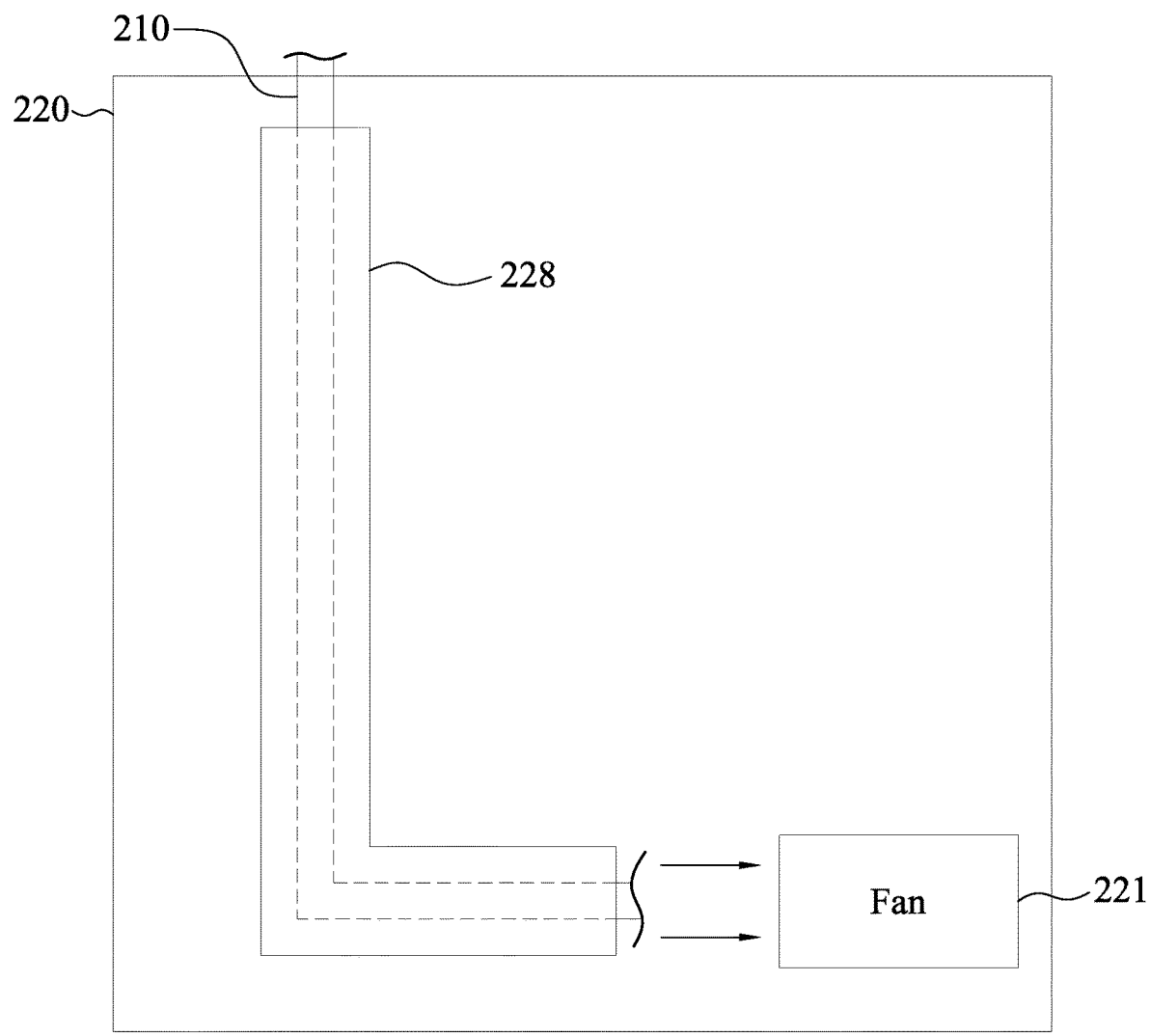
FIG. 5 is a schematic diagram of the cooler of the system as shown in FIG. 1, in accordance with various embodiments of the present disclosure.

In some embodiments, the cooler 220 is, for example, an air-cooling apparatus. The air-cooling apparatus is disposed by a side of the tube 210. For facilitating the understanding of the structure of the cooler 220, reference is now made to FIG. 5. FIG. 5 is a schematic diagram of the cooler 220 of the system as shown in FIG. 1, in accordance with various embodiments of the present disclosure.

As illustratively shown in FIG. 5, the cooler 220 includes a housing 228 and a fan 221. The housing 228 covers the tube 210. The fan 221 is configured to blow air inside the housing 228, such that the liquid 500 conveyed by the tube 210 may be cooled.

As illustratively shown in FIG. 5, in some embodiments, the fan 221 is disposed by a side of the concentration meter 230 in FIG. 1. Such disposition may help the fan 221 keeping away from the heater 140 in FIG. 1, or the fan 221 will blow the heat generated by the heater 140 to the tube 210 and the concentration meter 230 in FIG. 1.

The above discussion merely describes exemplary connections and operations that can be made in accordance with various alternative embodiments. It is understood that such various alternative embodiments are not limited to the specific connections and operations described above or those shown in FIG. 5.

In operation 350, the concentration meter 230 is configured to measure a concentration of the liquid 500 cooled by the cooler 220. In various embodiments, the temperature of the liquid 500 in the tank 110 is in a range of 65° C.-80° C. In some embodiments, the temperature of the liquid 500 in the tank 110 is about 70° C. The property of the medicament mixed in the liquid 500 will be presented by increasing its temperature and adding water to the liquid 500 for keeping its flow rate. When the temperature of the liquid 500 is lower than 65° C., the concentration of the liquid 500 will be too high to remove the residues of the semiconductor device 600. On the contrary, when the temperature of the liquid 500 is higher than 80° C., the removal rate of the liquid 500 is too high, such that the semiconductor device 600 might be damaged by the liquid 500.

In some embodiments, the temperature of the liquid 500 in the tank 110 is in a range of 65° C.-80° C. In various embodiments, the temperature of the liquid 500 in the tank 110 is in a range of 110° C.-120° C. If the tube 210 conveys the liquid 500 with such high temperature to the concentration meter 230, the measuring result of the liquid 500 by the concentration meter 230 is not precise. Therefore, the cooler 220 is configured to cool the liquid 500 conveyed by the tube 210 to a predetermined temperature within about two minutes. Compared with the prior art which cools liquid in a tube to a temperature in thirty minutes or more time, the present disclosure provides a system with the cooler 220 covering the tube 210 which may cool the liquid 500 conveyed by the tube 210 to a temperature in about two minutes. Therefore, it is more efficient to cool the liquid 500 by the system of the present disclosure in FIG. 1.

On the other hand, in various embodiments, the cooler 220 cools the liquid 500 in the tube 210 to a temperature in a range of 26° C.-29° C. In some embodiments, the cooler 220 cools the liquid 500 in the tube 210 to a temperature less than 29° C. Hence, the system of the present in FIG. 1 may cool the liquid 500 conveyed by the tube 210 to the temperature which the concentration meter 230 may measure the liquid 500 precisely.

In operation 360, the fan 240 is configured to cool the concentration measuring device 200. In various embodiments, the fan 240 in the concentration measuring device 200 is used for cooling the processor 260. However, due to the fan 240 being disposed inside the concentration measuring device 200, the fan 240 is helpful to cool the liquid 500 conveyed by the tube 210. In some embodiments, the fan 240 is disposed by a side of the concentration meter 230. Such disposition may help the fan 240 keeping away from the heater 140, or the fan 240 will blow the heat generated by the heater 140 to the concentration measuring device 200.

In operation 370, the pump 250 is configured to provide liquid into the tank 110 according to the concentration of the liquid 500. In operation 380, the heater 140 is configured to heat the liquid to a high temperature to remove residues of the semiconductor device 600 generated by manufacturing processes.

In some embodiments, the oscillator 160 together with the liquid 500 in the tank 110 are configured to remove residues of the semiconductor device 600 generated by manufacturing processes. In some embodiments, the oscillator 160 is, for example, an ultrasound oscillator. The ultrasound oscillator is used for provide ultrasound to help the semiconductor device 600 removing the residues generated by manufacturing processes. In various embodiments, the processor 260 is coupled between the concentration meter 230 and the pump 250, and the processor 260 is configured to control the pump 250, according to the concentration of the liquid 500, to provide liquid into the pipe 120, in order to adjust the concentration of the liquid 500. In some embodiments, the tank 110 further includes an outer tank 116. If the semiconductor device 600 is soaked in the liquid 500 and the inner tank 112 is overflowing, the overflowed liquid 500 is further contained by the outer tank 114. However, if the outer tank 114 is overflowing as well, the overflowed liquid 500 may be further contained by the outer tank 116.

Figure 6:
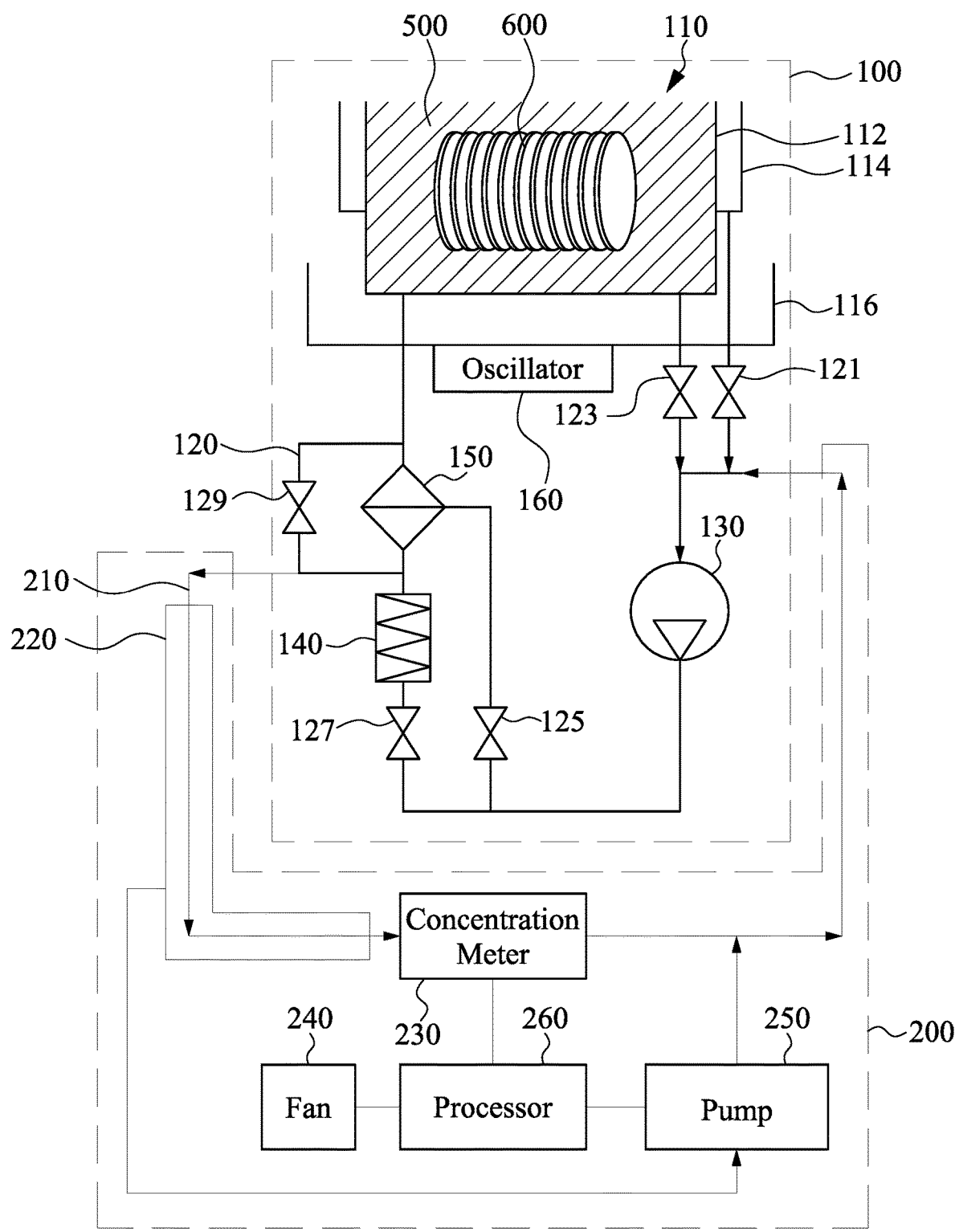
FIG. 6 is a schematic diagram of a system, in accordance with various embodiments of the present disclosure.

Reference is now made to FIG. 6. FIG. 6 is a schematic diagram of a system, in accordance with various embodiments of the present disclosure.

As illustratively shown in FIG. 6, the pump 224 in FIGS. 3-4 used for moving liquid in the spiral hose 222 and the condenser 226 may be replaced by the pump 250 in FIG. 6. The pump 250 in FIG. 6 is coupled to both of the cooler 220 and the concentration meter 230. The pump 250 is configured to move liquid in the cooler 220 for cooling the liquid 500 conveyed by the tube 210, and provide liquid into the tank 110 according to the concentration of the liquid 500. Therefore, owing to the pump 250 in FIG. 6 being used as the pump of the cooler 220, the pump 224 in FIGS. 3-4 inside the cooler 220 may be reduced. In various embodiments, the pump 250 is, for example, a deionized spiking pump.

The above discussion merely describes exemplary connections and operations that can be made in accordance with various alternative embodiments. It is understood that such various alternative embodiments are not limited to the specific connections and operations described above or those shown in FIG. 6.

Figure 7:
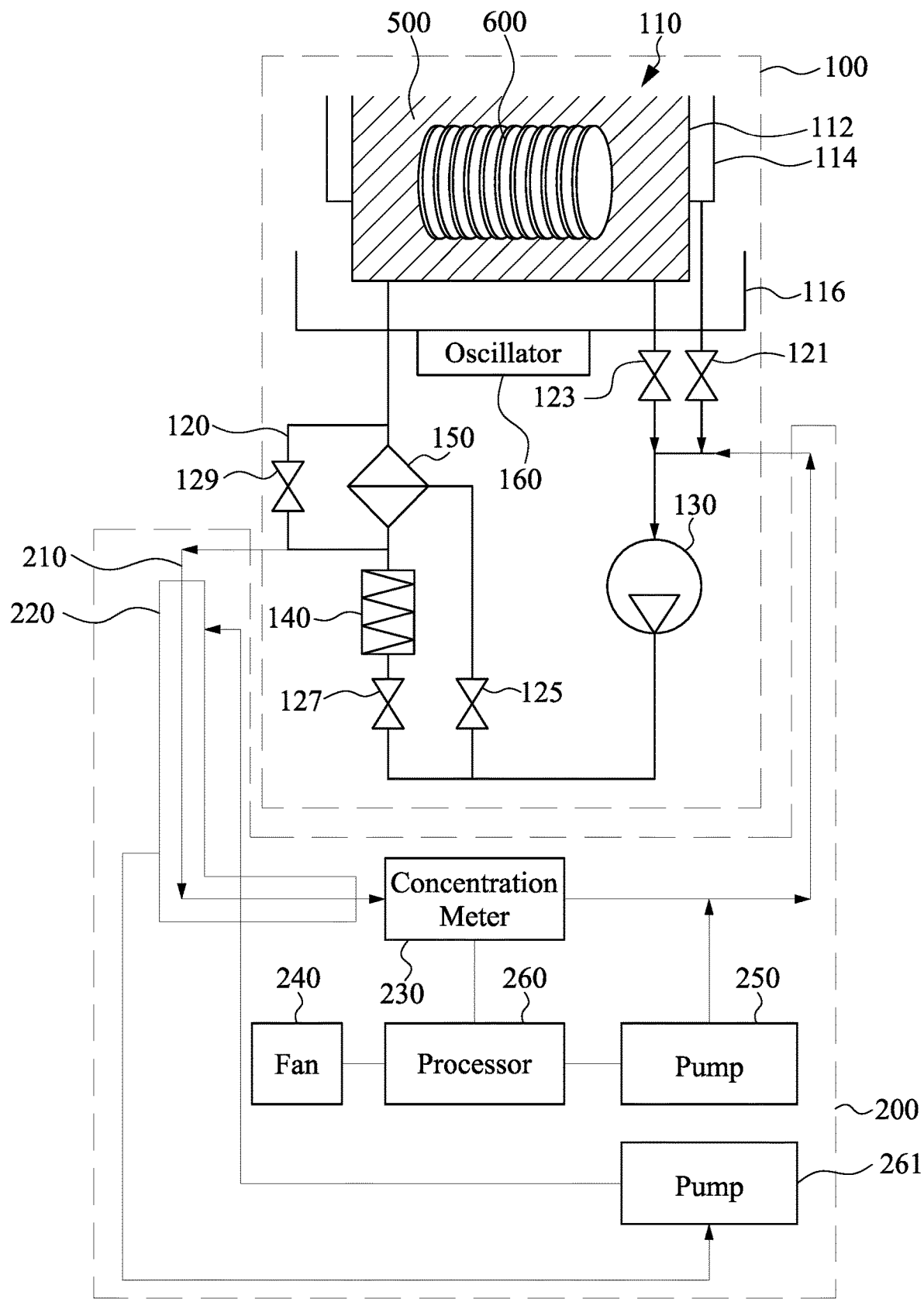
FIG. 7 is a schematic diagram of a system, in accordance with various embodiments of the present disclosure.

Reference is now made to FIG. 7. FIG. 7 is a schematic diagram of a system, in accordance with various embodiments of the present disclosure.

As illustratively shown in FIG. 7, the pump 224 in FIGS. 3-4 used for moving liquid in the spiral hose 222 and the condenser 226 may be replaced by the pump 261 in FIG. 7. The pump 250 is coupled to the concentration meter 230 and the processor 260. The pump 250 is configured to provide liquid into the tank 110 according to the concentration of the liquid 500 by the processor 260. On the other hand, the pump 261 is coupled to the cooler 220 and disposed adjacent to the concentration meter 230. In some embodiments, the pump 261 is disposed with the pump 250 in a parallel manner. The pump 261 is configured to move liquid in the cooler 220 for cooling the liquid 500 conveyed by the tube 210. In various embodiments, the pump 250 and the pump 261 are, for example, deionized spiking pumps.

The above discussion merely describes exemplary connections and operations that can be made in accordance with various alternative embodiments. It is understood that such various alternative embodiments are not limited to the specific connections and operations described above or those shown in FIG. 7.

Figure 8:
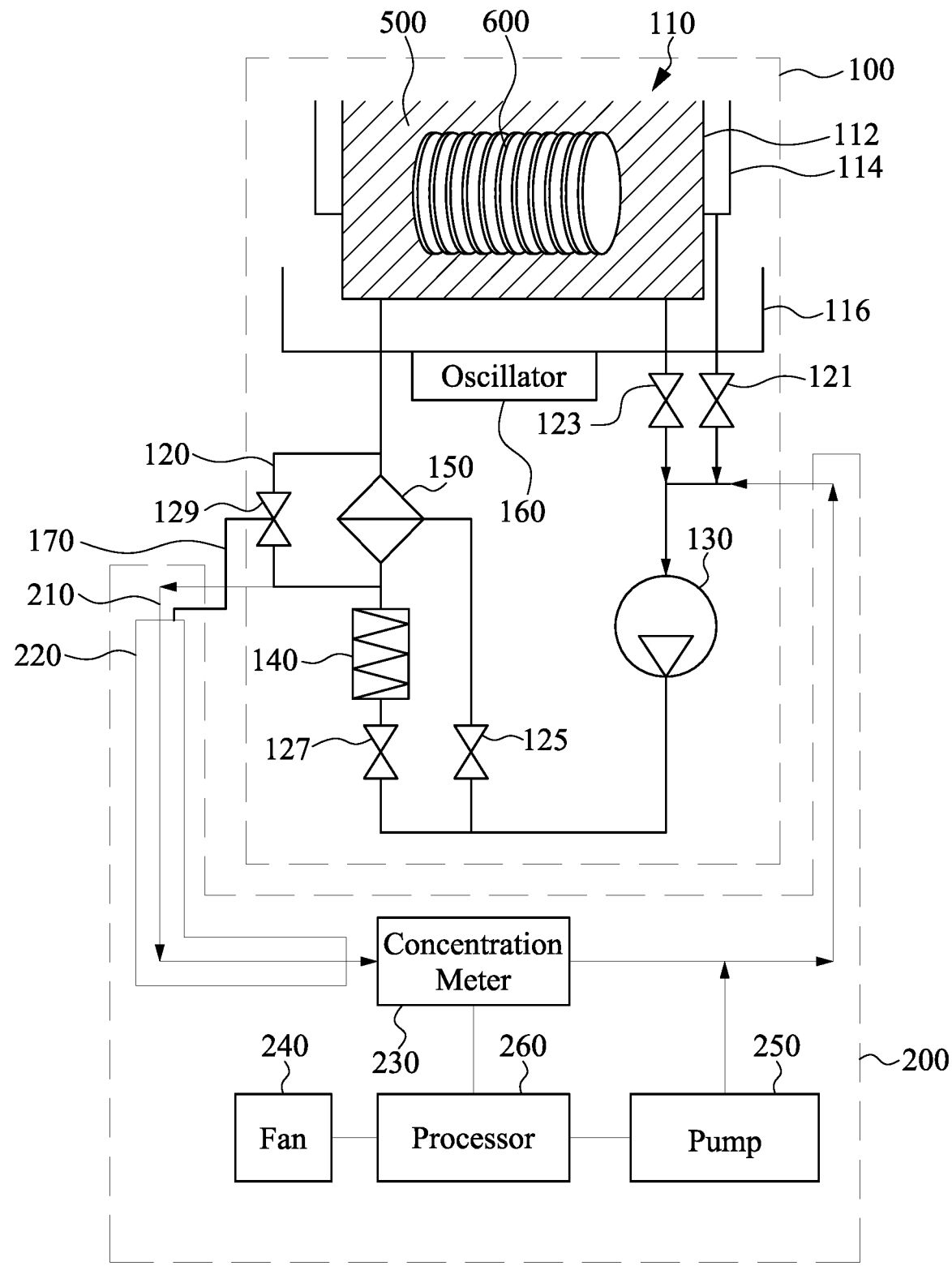
FIG. 8 is a schematic diagram of a system, in accordance with various embodiments of the present disclosure.

Reference is now made to FIG. 8. FIG. 8 is a schematic diagram of a system, in accordance with various embodiments of the present disclosure.

As illustratively shown in FIG. 8, the cleaning device 100 further includes at least one air valve 129 for controlling a flow path of the liquid 500 in the pipe 120, and air, for controlling the at least one air valve 129, is conveyed to the cooler 220 for cooling the liquid 500 conveyed by the tube 210. In some embodiments, the valve 129 is, for example, a pneumatic valve. The valve 129 is therefore controlled by air, and the air is conveyed by the pipe 170 to the cooler 220 for cooling the liquid 500 conveyed by the tube 210.

Figure 9:
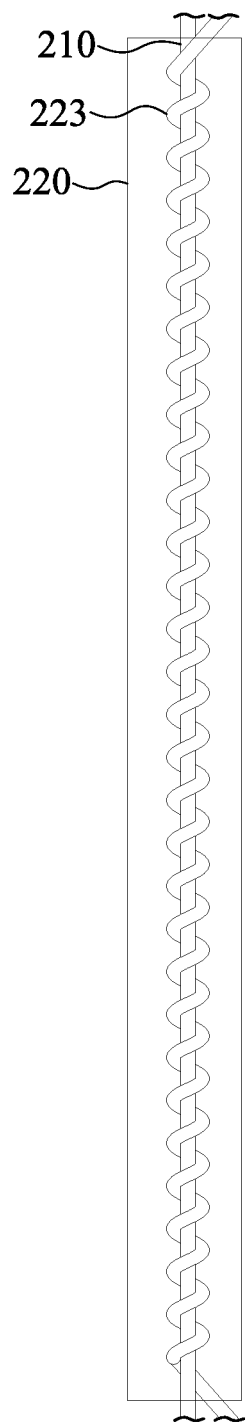
FIG. 9 is a schematic diagram of the cooler of the system as shown in FIG. 8, in accordance with various embodiments of the present disclosure.

For understanding the structure of the cooler 220, reference is now made to FIG. 9. FIG. 9 is a schematic diagram of the cooler 220 of the system as shown in FIG. 8, in accordance with various embodiments of the present disclosure.

As illustratively shown in FIG. 8, the cooler 220 includes a spiral hose 223, and the spiral hose 223 is disposed around the tube 210. In some embodiments, the spiral hose 223 is disposed around and contacted the tube 210 for facilitating the cooler 220 to cool the liquid 500 conveyed by the tube 210. In various embodiments, the spiral hose 223 is configured to convey the air, for controlling the valve 129, for cooling the liquid 500 conveyed by the tube 210. However, in some embodiments, the valves 121, 123, 125, 127 are, for example, pneumatic valves. Therefore, the spiral hose 223 is configured to convey the air for controlling the valves 121, 123, 125, 127 depending on actual requirements. In various embodiments, the spiral hose 223 is, for example, a Polyurethane (PU) tube, a PolyVinyl Chloride (PVC) tube, or any suitable kind of tube.

The above discussion merely describes exemplary connections and operations that can be made in accordance with various alternative embodiments. It is understood that such various alternative embodiments are not limited to the specific connections and operations described above or those shown in FIG. 9.

Figure 10:
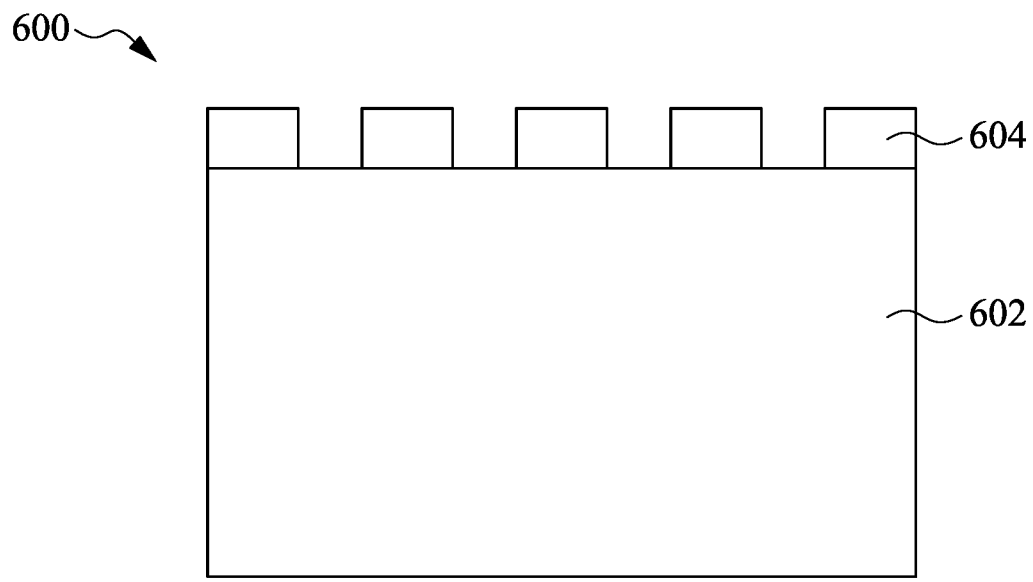
FIG. 10 is a schematic diagram of a cross-sectional view of the semiconductor device as illustrated in FIG. 1, in accordance with various embodiments of the present disclosure.
Figure 11:
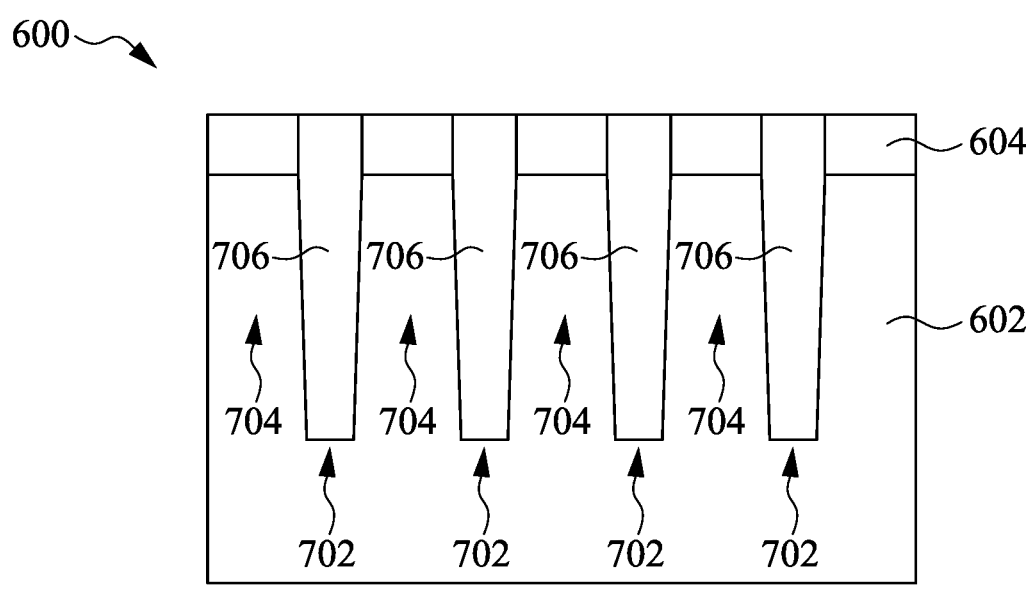
FIG. 11 is a schematic diagram of a cross-sectional view of the semiconductor device as illustrated in FIG. 1, in accordance with various embodiments of the present disclosure.
Figure 12:
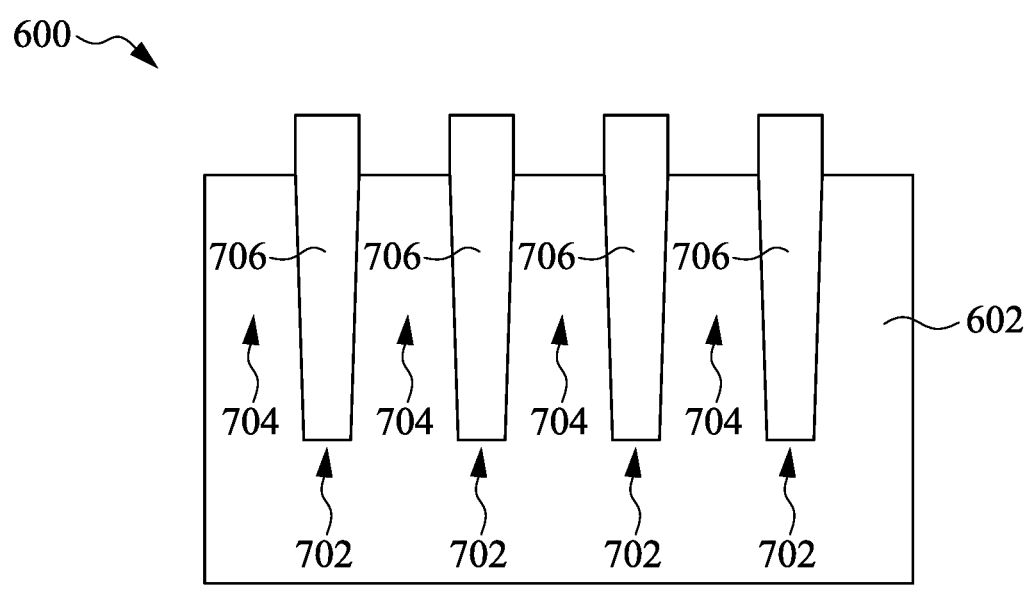
FIG. 12 is a schematic diagram of a cross-sectional view of the semiconductor device as illustrated in FIG. 1, in accordance with various embodiments of the present disclosure.

Reference is now made to FIG. 10. FIG. 10 is a schematic diagram of a cross-sectional view of the semiconductor device 600 as illustrated in FIG. 1, in accordance with various embodiments of the present disclosure. As shown in the figure, a patterned mask 604 is formed on a semiconductor substrate 602. Reference is now made to FIG. 11. FIG. 11 is a schematic diagram of a cross-sectional view of the semiconductor device 600 as illustrated in FIG. 1, in accordance with various embodiments of the present disclosure. As shown in the figure, exposed portions of the semiconductor substrate 602 may be etched to form the trenches 702 in the semiconductor substrate 602. The regions of the semiconductor substrate 602 between adjacent trenches 702 form fins 704. The trenches 702 may be filled by forming a dielectric layer 706 over the patterned mask 604 and substantially filling the trenches 702. Reference is now made to FIG. 12. FIG. 12 is a schematic diagram of a cross-sectional view of the semiconductor device 600 as illustrated in FIG. 1, in accordance with various embodiments of the present disclosure. As shown in the figure, the patterned mask 604 is removed. After the patterned mask 604 is removed, some residues are still on the semiconductor device 600. At this time, the semiconductor device 600 is put into the tank 110 which is filled with the liquid 500, and the liquid 500 is used for removing residues of the semiconductor device 600.

Also disclosed is a system. The system includes a cleaning device and a concentration measuring device. The cleaning device includes a first pipe and a first pump. The first pump is configured to move first liquid in the first pipe. Two terminals of the first pump are respectively coupled to the first pipe. The concentration measuring device includes a tube, a cooler, a concentration meter and a second pump. The tube is coupled to the first pipe, and is configured to retrieve the first liquid. The cooler covers the tube to cool the first liquid. The concentration meter is configured to measure a concentration of the first liquid cooled by the cooler.

The second pump is coupled to the tube, and is configured to move the first liquid according to the concentration.

Also disclosed is a system that includes a cleaning device and a concentration measuring device. The cleaning device includes a tank and a pipe. The tank is configured to contain first liquid. The pipe is coupled to the tank. The first liquid is flowed inside the pipe and the tank in circles. The concentration measuring device includes a tube, a cooler, a concentration meter, and a fan. The tube is coupled to the pipe and configured to convey the first liquid from the pipe. The cooler covers the tube to cool the first liquid conveyed by the tube. The concentration meter is configured to measure a concentration of the first liquid cooled by the cooler. The fan is disposed by a side of the concentration meter to cool the concentration measuring device.

Also disclosed is a method that includes the operations below. First liquid at a first temperature is derived from a tank via a tube. The first liquid conveyed by the tube is cooled to a second temperature by a cooler covering the tube. A concentration of the first liquid conveyed by the tube at the second temperature is measured. Second liquid into the tank is provided according to the concentration of the first liquid. The first liquid is heated to the first temperature to remove residues of a semiconductor device generated by manufacturing processes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
    a cleaning device, comprising:
        a first pipe; and
        a first pump configured to move first liquid in the first pipe, wherein two terminals of the first pump are respectively coupled to the first pipe; and
    a concentration measuring device, comprising:
        a tube coupled to the first pipe, and configured to retrieve the first liquid;
        a cooler covering the tube to cool the first liquid;
        a concentration meter configured to measure a concentration of the first liquid cooled by the cooler; and
        a second pump coupled to the tube, and configured to move the first liquid according to the concentration.

2. The system of claim 1, wherein the concentration meter is configured to measure the concentration after the first liquid is cooled to a predetermined temperature by the cooler.

3. The system of claim 1, wherein the concentration measuring device further comprises:
    a processor coupled between the concentration meter and the second pump, and configured to control the second pump according to the concentration, to provide second liquid into the first pipe, to adjust the concentration.

4. The system of claim 1, wherein the cleaning device further comprises:
    a tank coupled to the first pipe, and configured to contain the first liquid,
    wherein the second pump is further configured to move second liquid in the cooler for cooling the first liquid, and provide the second liquid into the tank according to the concentration.

5. The system of claim 1, wherein the concentration measuring device further comprising:
    a third pump coupled to the cooler and disposed with the second pump in a parallel manner, wherein the third pump is configured to move second liquid in the cooler.

6. The system of claim 1, wherein the cleaning device further comprises:
    a tank coupled to the first pipe, and configured to contain the first liquid; and
    an air valve coupled to the first pipe, and configured to provide the first liquid into the tank.

7. The system of claim 6, wherein the air valve is controlled by air, and the air is conveyed by a second pipe to the cooler, for cooling the first liquid.

8. The system of claim 1, wherein a diameter of the tube is smaller than a diameter of the first pipe.

9. A system, comprising:
    a cleaning device, comprising:
        a tank configured to contain first liquid; and
        a pipe coupled to the tank, wherein the first liquid is flowed inside the pipe and the tank in circles; and
    a concentration measuring device, comprising:
        a tube coupled to the pipe and configured to convey the first liquid from the pipe;
        a cooler covering the tube to cool the first liquid conveyed by the tube;
        a concentration meter configured to measure a concentration of the first liquid cooled by the cooler; and
        a fan disposed by a side of the concentration meter to cool the concentration measuring device.

10. The system of claim 9, wherein the cleaning device further comprises at least one air valve for controlling a flow path of the first liquid in the pipe, and air, for controlling the at least one air valve, is conveyed to the cooler for cooling the first liquid conveyed by the tube.

11. The system of claim 10, wherein the cooler comprises a spiral hose disposed around the tube, and the spiral hose is configured to convey the air, for controlling the at least one air valve, for cooling the first liquid conveyed by the tube.

12. The system of claim 10, wherein the cooler comprises:
    a housing covering the tube, wherein the air, for controlling the air valve, is conveyed to the housing for blowing air inside the housing.

13. The system of claim 9, wherein the cooler comprises:
    a housing covering the tube; and
    a second fan disposed by the concentration meter and configured to blow air inside the housing.

14. The system of claim 9, wherein the cooler comprises a water-cooling apparatus covering the tube, and the water-cooling apparatus comprises a spiral hose disposed around the tube.

15. The system of claim 9, wherein the concentration measuring device further comprises:
    a pump coupled to the cooler and the concentration meter, wherein the pump is configured to move second liquid in the cooler for cooling the first liquid conveyed by the tube, and provide the second liquid into the pipe according to the concentration of the first liquid.

16. The system of claim 9, wherein the concentration measuring device further comprises:

a first pump coupled to the concentration meter, wherein the first pump is configured to provide second liquid into the pipe according to the concentration of the first liquid; and a second pump coupled to the cooler and disposed adjacent the concentration meter, wherein the second pump is disposed with the first pump in a parallel manner, wherein the second pump is configured to move the second liquid in the cooler for cooling the first liquid conveyed by the tube.

17. The system of claim 16, wherein the concentration measuring device further comprises:

a processor coupled between the concentration meter and the first pump, wherein the processor is configured to control the first pump according to the concentration of the first liquid, and the fan is configured to cool the processor.

18. A method, comprising:

deriving first liquid at a first temperature from a tank via a tube;

cooling, by a cooler covering the tube, the first liquid conveyed by the tube to a second temperature;

measuring a concentration of the first liquid conveyed by the tube at the second temperature;

providing second liquid into the tank according to the concentration of the first liquid; and heating the first liquid to the first temperature to remove residues of a semiconductor device generated by manufacturing processes.

19. The method of claim 18, wherein cooling, by the cooler covering the tube, the first liquid conveyed by the tube to the second temperature comprises:

cooling, by a water-cooling apparatus comprising a spiral hose disposed around the tube, the first liquid conveyed by the tube to the second temperature.

20. The method of claim 18, wherein cooling, by the cooler covering the tube, the first liquid conveyed by the tube to the second temperature comprises:

cooling, by an air-cooling apparatus comprising a housing covering the tube and a fan blowing air inside the housing, the first liquid conveyed by the tube to the second temperature.

* * * * *